United States Patent
Hiblot et al.

(10) Patent No.: US 11,121,086 B2
(45) Date of Patent: Sep. 14, 2021

(54) VERTICAL ISOLATED GATE FIELD EFFECT TRANSISTOR INTEGRATED IN A SEMICONDUCTOR CHIP

(71) Applicant: IMEC vzw, Leuven (BE)

(72) Inventors: Gaspard Hiblot, Leuven (BE); Geert Van der Plas, Leuven (BE)

(73) Assignee: IMEC vzw, Leuven (BE)

( * ) Notice: Subject to any disclaimer, the term of this patent is extended or adjusted under 35 U.S.C. 154(b) by 99 days.

(21) Appl. No.: 16/716,262

(22) Filed: Dec. 16, 2019

(65) Prior Publication Data

US 2020/0203276 A1    Jun. 25, 2020

(30) Foreign Application Priority Data

Dec. 20, 2018   (EP) .................................. 18214426

(51) Int. Cl.

| | |
|---|---|
| *H01L 29/78* | (2006.01) |
| *H01L 23/528* | (2006.01) |
| *H01L 21/285* | (2006.01) |
| *H01L 21/768* | (2006.01) |
| *H01L 23/48* | (2006.01) |

(Continued)

(52) U.S. Cl.
CPC .... *H01L 23/5286* (2013.01); *H01L 21/28518* (2013.01); *H01L 21/76802* (2013.01);
(Continued)

(58) Field of Classification Search
CPC ............... H01L 29/78; H01L 21/76802; H01L 29/41741
See application file for complete search history.

(56) References Cited

U.S. PATENT DOCUMENTS

| 4,767,722 A | 8/1988 | Blanchard |
|---|---|---|
| 6,373,097 B1 | 4/2002 | Werner |

(Continued)

FOREIGN PATENT DOCUMENTS

| EP | 3 035 369 A1 | 6/2016 |
|---|---|---|
| EP | 3 324 436 A1 | 5/2018 |
| WO | WO 2012/144951 A1 | 10/2012 |

OTHER PUBLICATIONS

Extended European Search Report dated May 27, 2019 in EP Application No. 18214426.1.

*Primary Examiner* — Errol V Fernandes
(74) *Attorney, Agent, or Firm* — Knobbe Martens Olson & Bear LLP

(57) ABSTRACT

A vertical isolated gate FET transistor integrated in the front end of line of a semiconductor chip is disclosed. In one aspect, the transistor includes a modified version of a buried power rail and back side TSV (through semiconductor via) connection for connecting the front end of line to a back side signal delivery network, such as a power delivery network (PDN), the PDN being arranged on the backside of the semiconductor substrate that carries the active devices of the FEOL on its front side. In contrast to standard power rail/TSV combinations, the TSV is not electrically connected to the rail, but isolated therefrom by a dielectric plug at the bottom of the rail. The TSV is isolated from the semiconductor substrate by a dielectric liner. Well regions are furthermore provided on the front side, enveloping the rail and the dielectric plug, and on the backside, surrounding the TSV and liner. On the back side, the well includes a contact area adjacent the TSV. The TSV thereby acts as the gate of the transistor, while the rail and the contact area respectively act as source and drain or vice versa.

15 Claims, 10 Drawing Sheets

(51) Int. Cl.
  *H01L 29/417* (2006.01)
  *H01L 29/423* (2006.01)
  *H01L 29/45* (2006.01)
  *H01L 29/66* (2006.01)
  *H02M 3/158* (2006.01)

(52) U.S. Cl.
  CPC .. *H01L 21/76877* (2013.01); *H01L 21/76898* (2013.01); *H01L 23/481* (2013.01); *H01L 29/41741* (2013.01); *H01L 29/42376* (2013.01); *H01L 29/456* (2013.01); *H01L 29/66712* (2013.01); *H01L 29/7812* (2013.01); *H02M 3/158* (2013.01)

(56) References Cited

U.S. PATENT DOCUMENTS

| | | | |
|---|---|---|---|
| 6,380,569 B1* | 4/2002 | Chang | H01L 29/0623 257/107 |
| 8,450,786 B2* | 5/2013 | Kim | H01L 21/82345 257/306 |
| 10,461,186 B1* | 10/2019 | Zhang | H01L 29/66666 |
| 10,916,638 B2* | 2/2021 | Cheng | H01L 23/535 |
| 2011/0253981 A1* | 10/2011 | Rooyackers | B82Y 10/00 257/24 |
| 2012/0146711 A1 | 6/2012 | Bartley et al. | |
| 2013/0043526 A1* | 2/2013 | Iyer | H01L 29/66734 257/330 |
| 2014/0291755 A1* | 10/2014 | Baek | H01L 29/4236 257/330 |
| 2014/0295658 A1 | 10/2014 | Blank et al. | |
| 2015/0091084 A1 | 4/2015 | Lee et al. | |
| 2015/0255619 A1* | 9/2015 | Shimabukuro | H01L 27/115 257/314 |
| 2017/0133374 A1 | 5/2017 | Ng et al. | |
| 2017/0287812 A1* | 10/2017 | Safran | H01L 22/34 |
| 2018/0130902 A1* | 5/2018 | Yang | H01L 29/0653 |
| 2020/0066599 A1* | 2/2020 | Zhang | H01L 21/823437 |

* cited by examiner

VERTICAL ISOLATED GATE FIELD EFFECT TRANSISTOR INTEGRATED IN A SEMICONDUCTOR CHIP

CROSS-REFERENCE TO RELATED APPLICATION

This application claims foreign priority to European Patent Application No. 18214426.1, filed Dec. 20, 2018, the contents of which are incorporated by reference herein in its entirety.

BACKGROUND

Technological Field

The disclosed technology is related to semiconductor processing, in particular to the production of devices which are capable of operating as power switches for the supply of power to the logic devices on an integrated circuit (IC) chip.

Description of the Related Technology

Power conversion is required to lower the battery voltage down to the supply voltage of active devices on an IC, such as the transistors that make up a CMOS logic cell. This is typically achieved with a buck converter comprising one coil and two power switches. The power switches are generally dedicated transistors capable of carrying current at high voltage and without resistive drops. One example of a transistor type known to be used for this purpose is a Vertical Double-Diffused MOSFET transistor, known as such in the art and usually abbreviated as a VDMOS transistor. A VDMOS is, for example, described in U.S. Pat. No. 4,767,722. Currently these power switches are not integrated in the IC itself, but they are processed on a separate power IC. This is, however, an expensive solution.

SUMMARY OF CERTAIN INVENTIVE ASPECTS

The disclosed technology aims to provide an integrated circuit chip having one or more VDMOS transistors integrated thereon. The disclosed technology is related to the transistor as such, to a chip comprising one or more of the transistors, to a buck converter implementing transistors according to the disclosed technology and to a method for producing the transistor. In the appended claims, the term "insulated gate field effect transistor" is used for describing the transistor type to which the disclosed technology is related. This term is broader than the more commonly used MOSFET (metal-oxide-semiconductor FET) term, although both terms are often used interchangeably and as synonyms of one another. For the sake of conciseness, the detailed description will use the term "VDMOS", but this is not intended to limit the scope of the disclosed technology.

A vertical isolated gate FET transistor according to the disclosed technology is integrated in the front end of line of a semiconductor chip. The transistor includes a modified version of a buried power rail and back side TSV connection known for connecting the front end of line to a back side power delivery network, the PDN being arranged on the backside of the semiconductor substrate that carries the active devices of the FEOL on its front side. The abbreviation TSV is known for indicating "through silicon via", but in the present context may be read as "through substrate via", wherein the "substrate" is optionally a semiconductor substrate. As opposed to a standard power rail/TSV combination, the TSV is not electrically connected to the rail, but isolated therefrom by a dielectric plug at the bottom of the rail. The TSV is isolated from the semiconductor substrate by a dielectric liner. Well regions are furthermore provided on the front side, enveloping the rail and the dielectric plug, and on the backside, surrounding the TSV and liner. On the back side, the well furthermore comprises a contact area adjacent the TSV. The TSV thereby acts as the gate of the transistor, while the rail and the contact area respectively act as source and drain or vice versa. The term TSV connection, or simply TSV, may be interpreted broadly in terms of the shape of the cross-section of this connection. TSV connections between a buried rail and the PDN may have elongate cross-sections, resembling a trench for example. This shape falls within the meaning of the term TSV within the context of this patent application. The term "power delivery network" or PDN is used throughout the detailed description. A more general term for this network is used in the appended claims, namely a "signal delivery network". In a PDN, two of the delivered signals are a power and ground signal. The term "signal delivery network", however, includes networks configured for delivering any signal type.

The disclosed technology is in particular related to a vertical insulated gate field effect transistor integrated in a semiconductor chip that includes a substrate formed of a doped semiconductor material, the substrate having a front side and a back side, wherein a front end of line and a back end of line portion are present on the front side,
characterized in that the transistor includes:
in the substrate and located at the front side thereof, a first well region having a lower side,
in the substrate and located at the back side thereof and having an upper side spaced apart from the lower side of the first well region, a second well region,
a rail formed of an electrically conductive material, and buried at least partially in the first well region, and provided with a dielectric plug in physical contact with the underside of the rail, and configured so that the rail does not extend beyond the lower side of the first well region, wherein the rail is the source or drain electrode of the transistor,
a through substrate via (TSV) between the back side of the substrate and the dielectric plug, and a liner isolating the TSV from the substrate and from the second well region, wherein the dielectric plug isolates the TSV from the rail and wherein the TSV acts as the gate electrode of the transistor, with the liner acting as the gate dielectric, a contact area in the second well region, the contact area being exposed at the back side of the substrate, wherein the contact area is respectively the drain or source electrode of the transistor.

According to an embodiment, the substrate includes at least two conductors on its back side, connected respectively to the TSV and to the contact area. In the latter embodiment, the conductors on the back side of the substrate may be part of a signal delivery network arranged on the back side of the substrate.

The chip may further include a plurality of interconnect rails buried at least partially in the substrate, where the interconnect rails are:
coupled to active devices in the FEOL portion through local interconnects embedded in a interlayer dielectric (ILD) layer on the front side of the substrate,
electrically connected to the signal delivery network on the back side of the substrate through TSV connections, and wherein the interconnect rails and the assembly of the rail and the dielectric plug are formed in a plurality of trenches which are obtainable by a single etching step.

According to an embodiment, the substrate is formed of a doped material of a first doping type, and the first and second well regions are formed of a second doping type opposite the first doping type. According to an embodiment, the substrate is formed of a doped material of a first doping type, and wherein:

the first and the second well regions are of the first doping type, and
the first well region is embedded in a third well region, the third well region being of a second doping type opposite the first.

The substrate may be a p-doped or n-doped silicon substrate. The dielectric plug may be formed of silicon nitride. The contact area in the second well region may be formed of a metal silicide.

According to an embodiment, the first well region is a standard well region of the semiconductor chip, the first well region comprising active devices of the FEOL portion.

The disclosed technology is also related to a buck converter circuit for supplying power to active devices in a front end of line portion of a semiconductor chip, the circuit including a pull-up transistor, a pull-down transistor and an inductance, wherein the pull-up and pull-down transistors are transistors integrated in the semiconductor chip, in accordance with the disclosed technology.

The disclosed technology is also related to a method for producing a transistor, including:

providing a wafer having on its surface a doped semiconductor substrate that includes a first well region at the front of the substrate and a second well region at the back of the substrate and spaced apart from the first well region,
on the front of the substrate, producing a front end of line portion, and depositing an ILD dielectric layer on top of the FEOL portion,
etching at least one trench in the front side of the substrate, through the ILD dielectric layer and into the front of the substrate,
depositing a dielectric layer that fills the trench and forms a blanket layer on the front surface of the substrate,
thinning the blanket layer everywhere except in a selected area above the trench,
etching back the material of the dielectric layer until a dielectric plug remains at the bottom of the trench,
filling the trench with an electrically conductive material, and etching back the electrically conductive material so as to obtain a buried rail,
producing a back end of line portion on the FEOL portion,
reversing the wafer and attaching the back end of line side of the wafer to an auxiliary substrate,
thinning the wafer until the back side of the substrate is exposed,
producing a contact area in the second well region and exposed at the back side of the substrate,
depositing a passivation layer on the back side of the substrate,
producing a first via opening through the passivation layer and the substrate, at the location of the rail, until reaching the dielectric plug,
producing a second via opening through the passivation layer, until reaching the contact area in the second well region,
producing a dielectric liner on the sidewall of the first via opening, and
filling the first and second via openings with an electrically conductive material, thereby producing a first and second TSV.

The method of the disclosed technology may further include forming conductors for separately contacting the first and second TSV on the back side of the substrate. The conductors may be part of a power delivery network formed on the back side of the substrate.

According to an embodiment, the method of the disclosed technology can also include:

additional trenches are produced which have the same depth and dimensions of the at least one trench, and which are all filled with the dielectric layer,
the step of etching back the dielectric layer continues until the material of the dielectric layer is fully removed from the additional trenches, so that the dielectric plug remains in only one or some of the full number of trenches,
the additional trenches are filled with an electrically conductive material simultaneously with the filling of the trench having the dielectric plug at the bottom,
additional via openings are etched from the back of the substrate, simultaneously with the etching of the via opening at the location of the dielectric plug, and
the additional via openings are filled with an electrically conductive material simultaneously with the filling of the first and second via openings.

DETAILED DESCRIPTION OF CERTAIN ILLUSTRATIVE EMBODIMENTS

According to the disclosed technology, a VDMOS transistor is produced in a process that integrates the VDMOS transistor in the front end of line of a semiconductor integrated circuit chip, together with low power device configurations such as logic cells. The disclosed technology takes advantage of a known development which is the production of buried power rails integrated in the front end of line portion of the IC fabrication process. Example implementations are described in a previous patent application by the present applicant, published as European Publication No. EP3324436 A1, which is incorporated herein by reference in its entirety. In this patent application, buried power rails are connected by TSV (through semiconductor via) connections to a power delivery network (PDN) located entirely on the backside of the chip. The disclosed technology takes advantage of the characteristics of this configuration, for producing an integrated VDMOS with minimal impact on the standard fabrication process.

Figure 1:
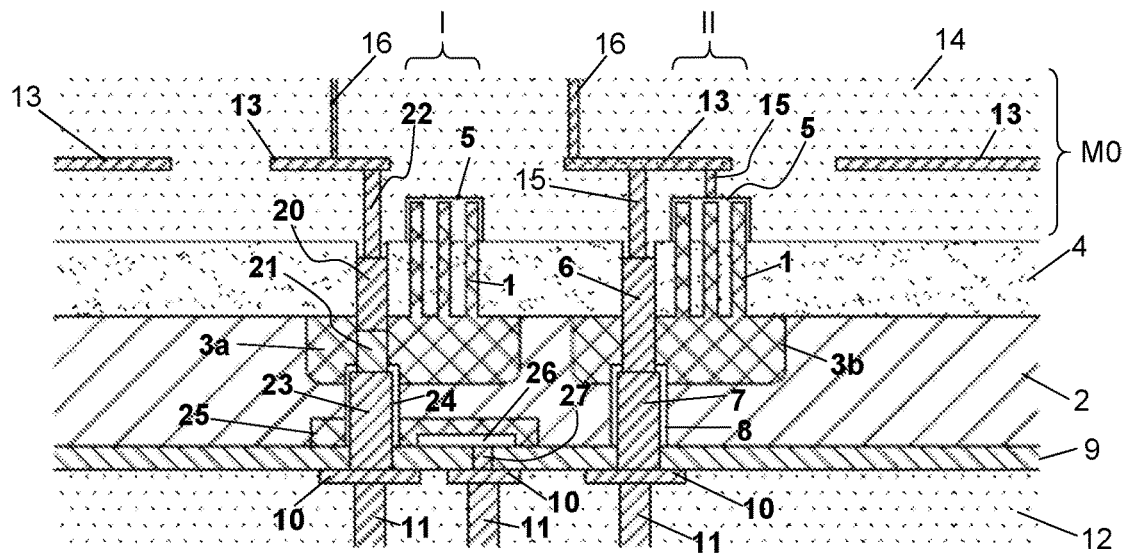
FIG. 1 illustrates a VDMOS transistor in a configuration according to an embodiment of the disclosed technology.

An example of an integrated VDMOS according to the disclosed technology is illustrated in FIG. 1. The drawing shows two sets I and II of 3 semiconductor fins 1, which are uniform with a semiconductor substrate 2, which is taken to be a p-doped silicon substrate in this detailed description, even though the disclosed technology is not limited thereto. N-type well regions 3a and 3b are created at the location of the fins. Other areas of the substrate may include p-wells or adjacent p- and n-wells, depending on the required functionality of the active devices produced on the active portion of the fins. This active portion is situated at the top of the fins, whereas the base of the fins is embedded in a layer 4 of dielectric material, commonly referred to as the shallow trench isolation (STI) dielectric layer. Contact areas 5 are depicted in a simplified way on the top area of the fins. These are epitaxially grown areas for contacting selected sections of the fins, primarily source or drain areas of transistors which carry current in the direction of the fins, controlled through gate electrodes and gate dielectric layers extending transversally with respect to the fins. Gate electrodes are not shown in the particular section illustrated in FIG. 1, but their function and physical characteristics can be implemented in any suitable manner. The group of fins II on the right hand side is a standard group of fins, which can produced and powered in the manner described in European Publication No. EP3324436A1. Adjacent the group of fins II is a buried power rail 6, that is embedded partially in the n-well 3b and in the STI layer 4. The buried rail 6 is connected to the back side of the substrate 2 by a TSV connection 7 that is isolated from the p-substrate 2 by a dielectric liner 8. At the back of the substrate 2 is a passivation layer 9 that carries the Power Delivery Network, of which a first layer is shown in FIG. 1. The PDN comprises one or more such layers formed of conductors 10 and via-connections 11 embedded in a layer of dielectric material 12, and ultimately connected to a power or a reference (normally ground) terminal. Example implementations are described in more detail in European Publication No. EP3324436A1. On the top side of the substrate 2, the buried rail 6 is coupled to a first metallization layer, sometimes referred to as the M0 level, and including so-called "local interconnects", which are conductors 13 embedded in a dielectric layer 14, referred to in this context as an ILD layer (interlayer dielectric). Through via connections 15, one of these conductors 13 is coupled to the buried rail 6 and to the contact area 5 on the fins, thereby forming a direct connection between the rail and the fins. Through further via connections 16, the local interconnects 13 are coupled to additional metallization layers M1, M2 etc. (not shown), which form the back end of line portion of the chip.

Implementations of the aforementioned features can be implemented in any suitable manner such that additional detail is not provided for conciseness of this description. The group of fins I on the left-hand side is also formed on an n-well 3a on the upper surface of the substrate, and a buried rail 20 is again located adjacent the fins 1. However, by a minimal deviation from the normal production process, an n-type VDMOS transistor is produced in an area situated around a selected portion of the rail 20. The production process will be described in more detail hereafter. The obtained structure is visible in FIG. 1. At the bottom of the trench into which the buried rail 20 is formed, there is now a plug 21 formed of a dielectric material, for example silicon nitride. On top of the SiN plug, the rest of the trench is filled with conductive material, in some cases the same conductive material as the standard rail 6, and coming up to the same level as the standard rail 6. The "modified" rail 20 is connected to the M0 level in the same way as the standard rail, by a TSV connection 22. The SiN plug itself is in direct physical contact with a TSV connection 23 that is identical to the TSV connection 7 that connects the standard rail 6 to the back side PDN. A liner 24 separates the TSV 23 from the substrate 2. On the back side of the substrate 2, another distinctive feature is visible. An n-well 25 is formed on this back side, with the TSV 23 penetrating the n-well 25. The upper side of the n-well 25 is spaced apart from the lower side of the n-well 3a at the front of the substrate 2. The n-well 25 furthermore extends laterally away from the TSV 23, and there it envelops a contact area 26 located adjacent the TSV 23 and open to the back surface of the substrate 2, which may be a metal silicide area. The contact area 26 is connected to the PDN by a short via connection 27 through a passivation layer 9 on the back surface of the substrate 2. The TSV 23 and the short via connection 27 are connected to separate conductors 10 in the PDN.

The resulting structure is equivalent to a VDMOS transistor, with the p-type substrate 2 acting as a first diffusion and the n-well 25 as the second diffusion of the "double diffusion" structure. The silicide contact area 26 on the backside is the source electrode of the VDMOS. The TSV 23 is the gate electrode and the liner 24 plays the part of the gate dielectric. When the transistor is in the ON state, obtained by applying a suitable voltage to the TSV 23 (the gate) through the PDN network, a channel is formed in the p-type substrate material around the TSV 23 and between the n-wells 3a and 25. The presence of the SiN plug 21 creates a drift region in the upper n-well 3a, between the channel and the portion of the rail 20 above the plug, the latter playing the part of the drain of the VDMOS. A vertical current path is thereby created from the source 26 to the drain 20.

Figures 2A, 2B:
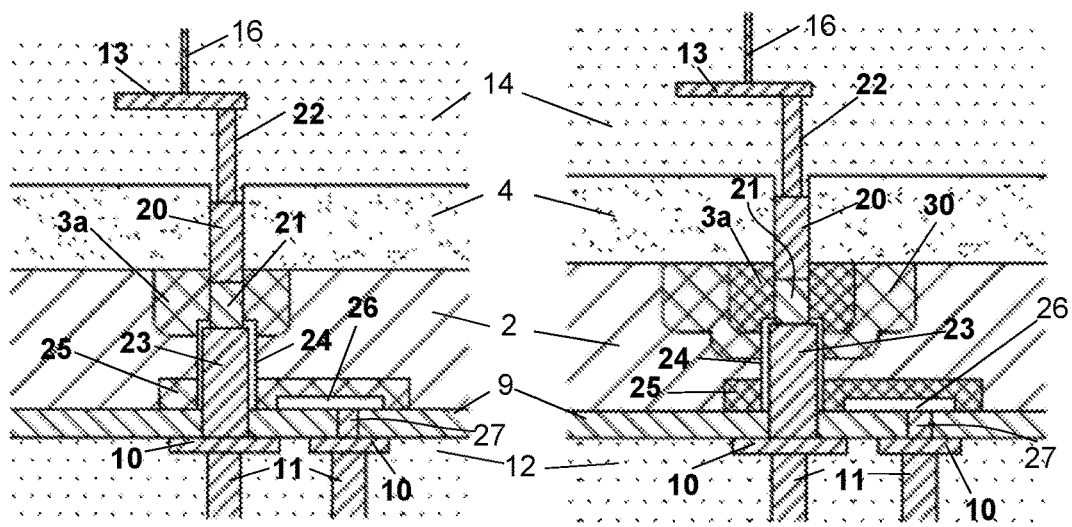
FIGS. 2A to 2C show alternative embodiments of the transistor according to the disclosed technology.

The fins of the first group I shown in FIG. 1 do not perform a function in the operation of the VDMOS. They are included in the drawing in order to illustrate that the VDMOS can be integrated in an existing fabrication process of an IC with minimal changes to the layout and process steps. In the existing process, the creation of the n-well 3a and of the trench for forming the rail 20 is already included. It is only needed to perform a number of additional steps in order to create the VDMOS, as will be described in more detail hereafter. It is also possible to dedicate a specific n-well 3a to the creation of the n-type VDMOS, as illustrated in FIG. 2A. All the other components indicated in this drawing are the same as described in relation to FIG. 1. Alternatively, a p-type VDMOS according to the disclosed technology may be produced, with additional well implant steps. This is illustrated in FIG. 2B. The well 25 on the backside of the substrate is now a p-well, while a deep n-well 30 is required on the front side, with the p-well 3a embedded therein so that the SiN plug 21 is now enveloped by the p-well 3a. The deep n-well 31 is needed to isolate the p-well 3a from the substrate. The channel is formed in the area of the substrate 2 and of the deep n-well 30 surrounding the TSV 23. One part of the channel is now "enhancement type" (substrate 2) and the other part is "depletion type" (deep N-well 30). However, the conductivity of the channel is still controlled by the gate 23. Carriers go from one p+ junction to another p+ junction and punchthrough current lines (not controlled by the gate) are cut off by the deep n-well 30.

Figure 2C:
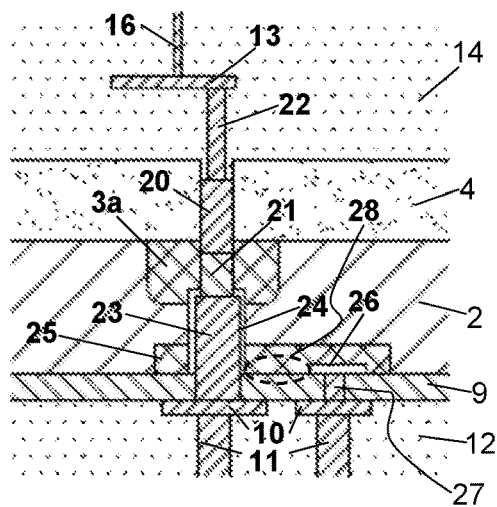

The functions of source and drain are not exclusively dedicated to the silicide area 26 and the rail 20, but these functions may be reversed, i.e., the rail may be the source of the transistor, and the silicide area may be the drain. Physically, this requires a drift region in the well 25 at the back side of the substrate 2, so it is optional to place the silicide area 26 further away from the TSV 23, as illustrated in FIG. 2C for an n-type VDMOS according to the disclosed technology. The drift region 28 is indicated in FIG. 2C.

Figure 3A:
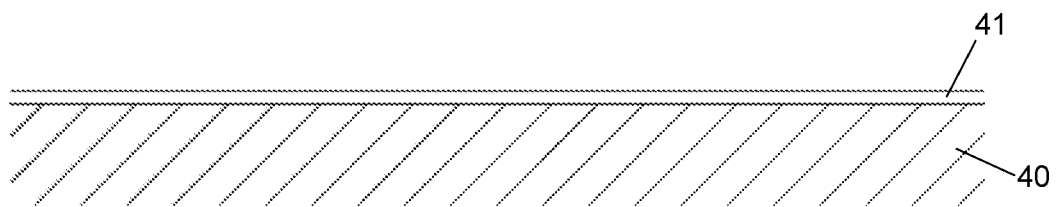
FIGS. 3A to 3O illustrate example process steps for producing the transistor configuration shown in FIG. 1.
Figure 3B:
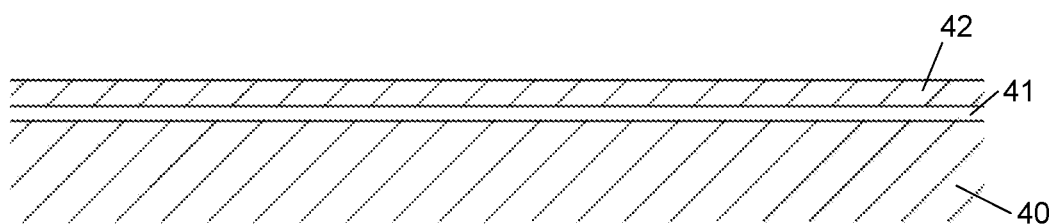
Figure 3C:
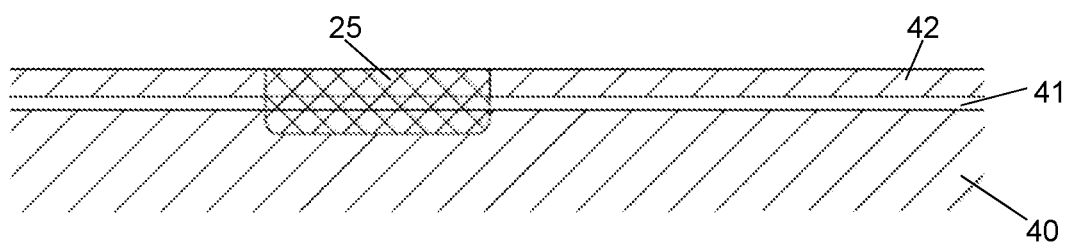
Figure 3D:
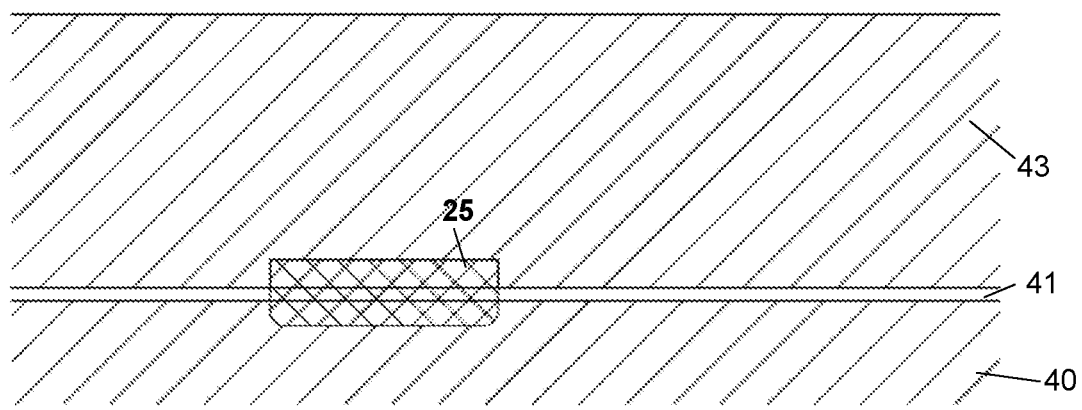
Figure 3E:
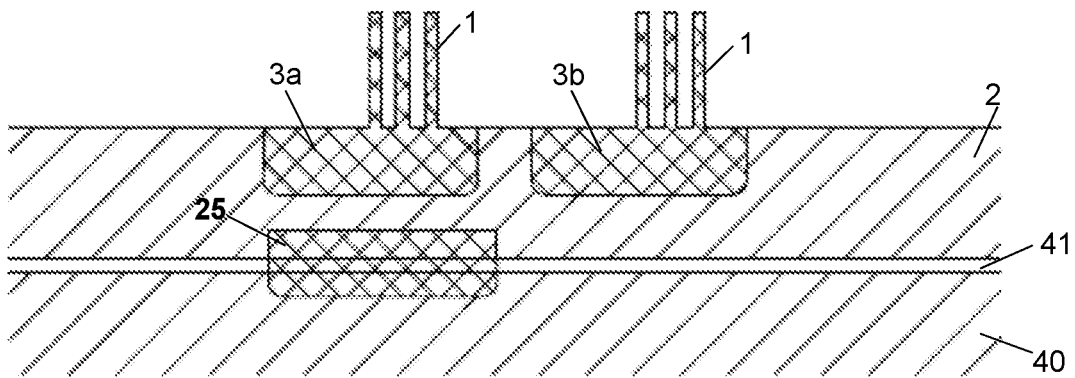
Figure 3F:
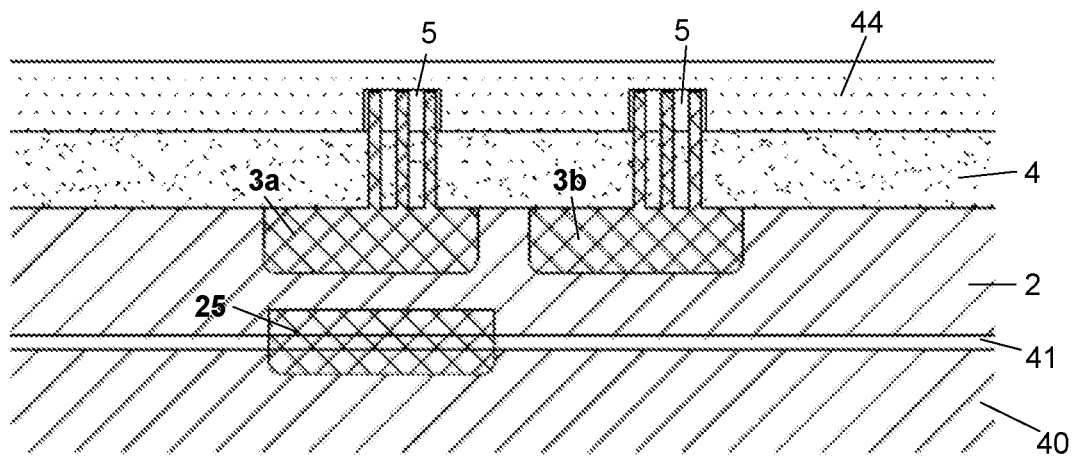
Figure 3G:
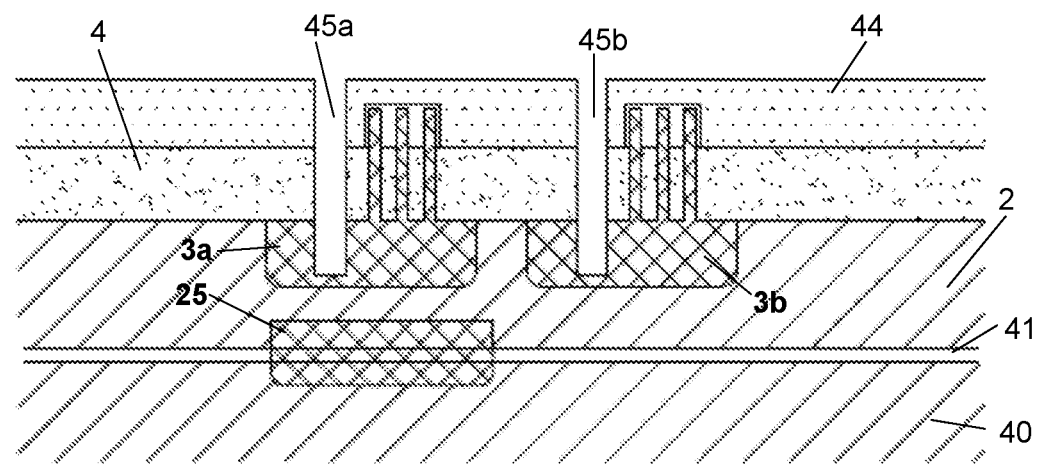
Figure 3H:
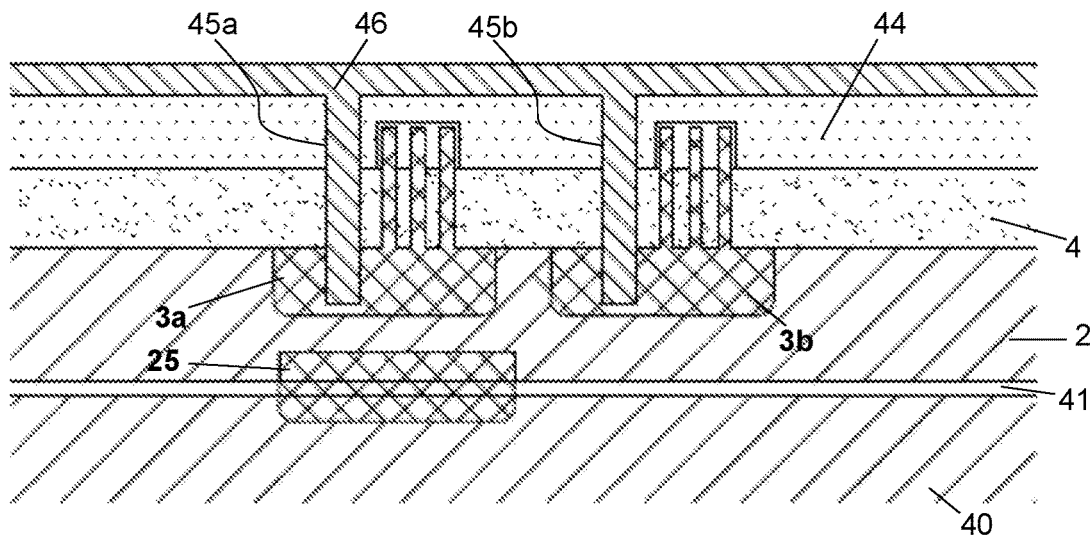
Figure 3I:
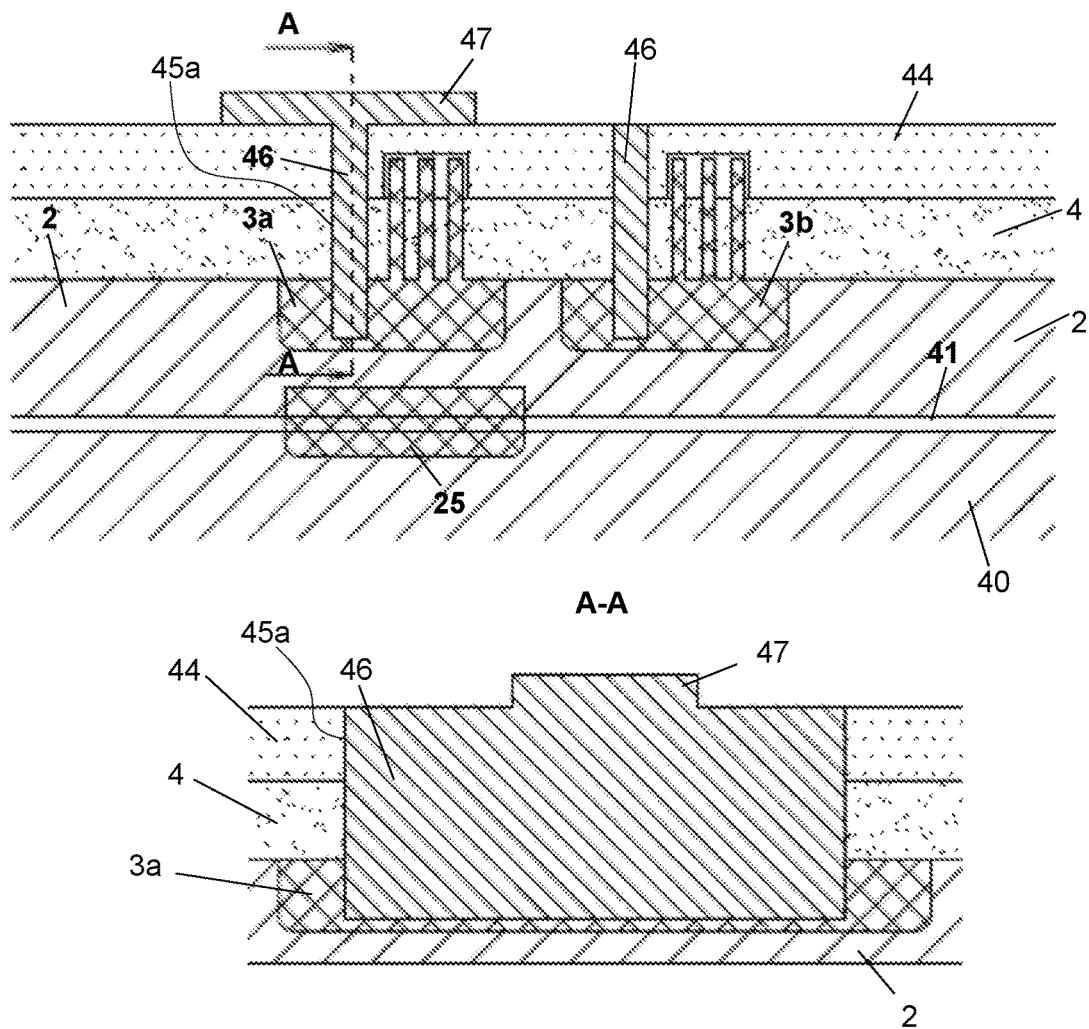
Figure 3J:
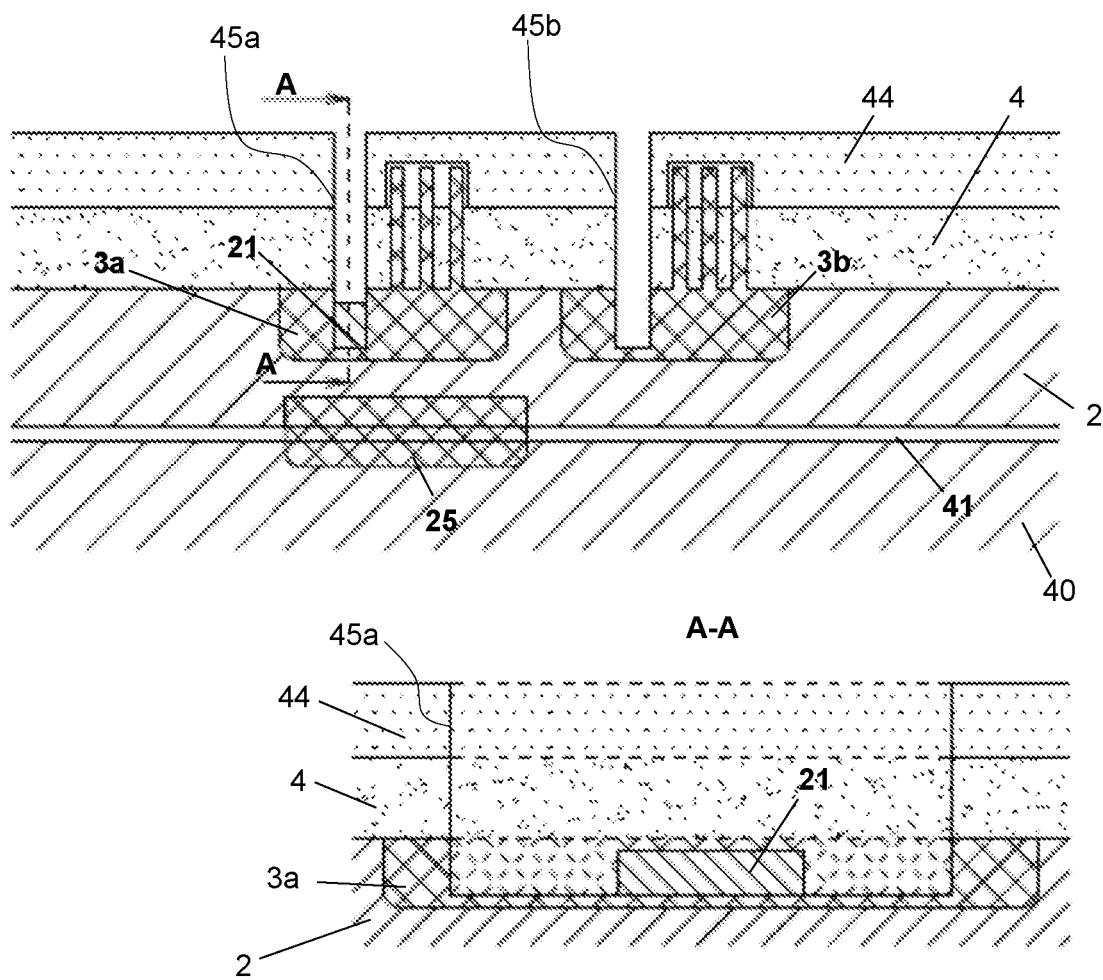
Figure 3K:
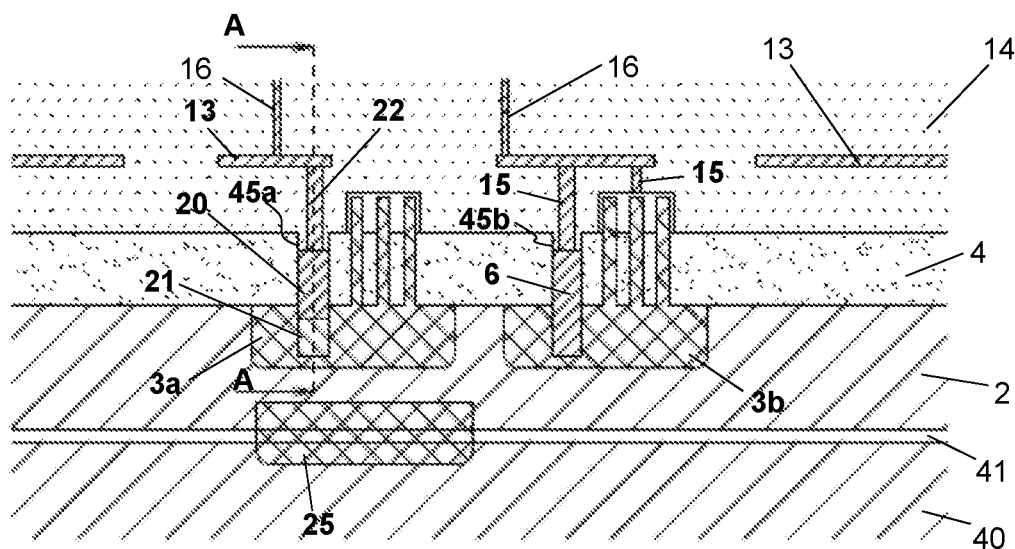
Figure 3K:
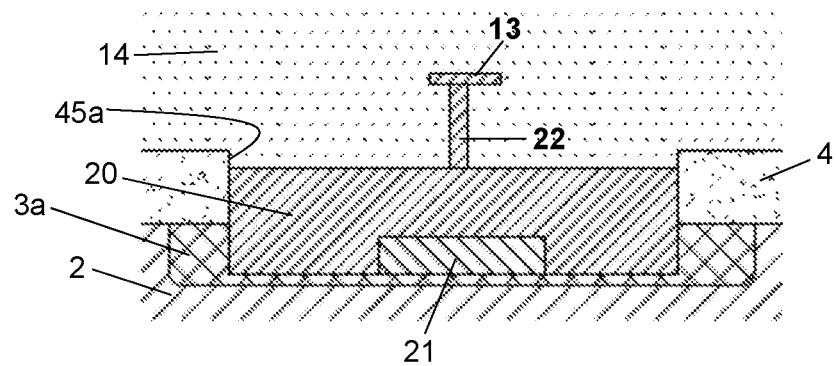
Figure 3L:
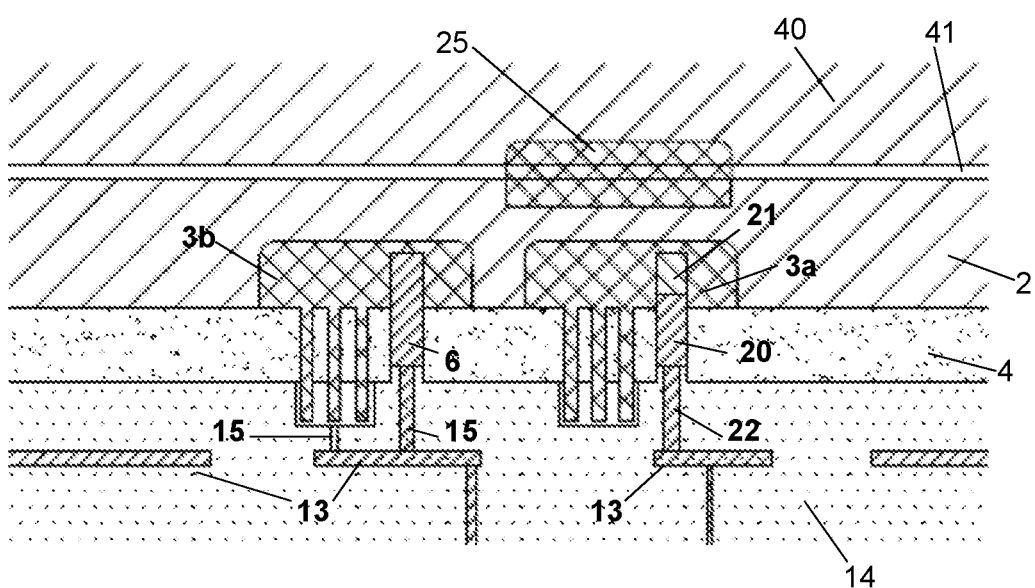
Figure 3M:
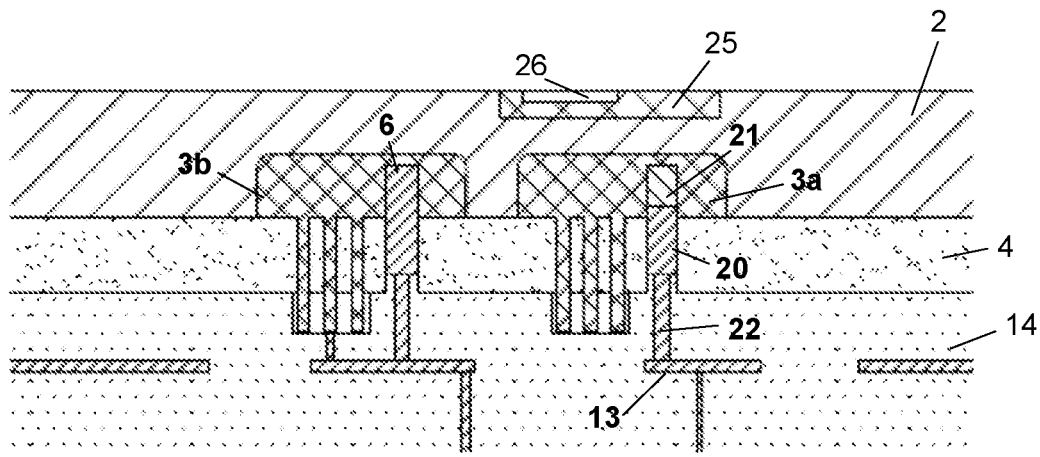
Figure 3N:
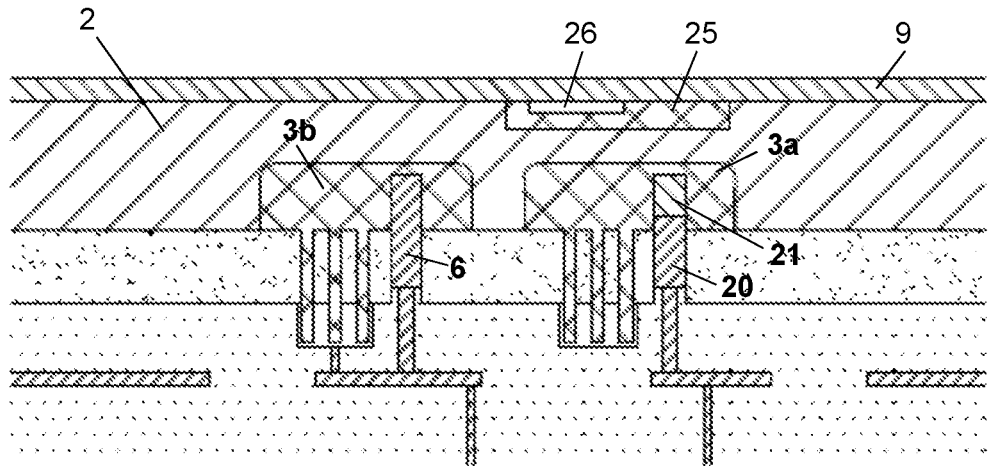
Figure 3O:
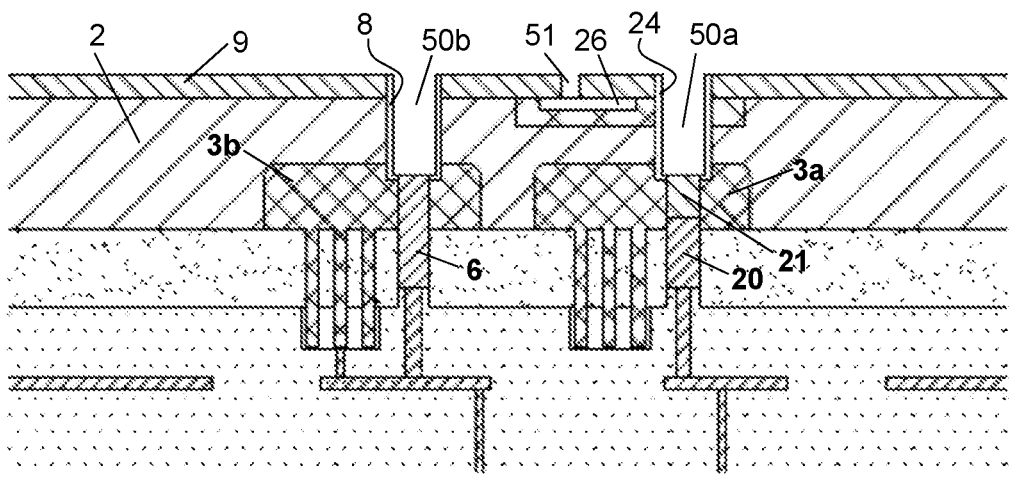

FIGS. 3A to 3O illustrate a number of exemplary steps of a fabrication process that integrates a VDMOS in an integrated circuit chip in the manner shown in FIG. 1. The materials cited hereafter are not intended to limit the scope of the disclosed technology. As seen in FIG. 3A, a silicon process wafer 40 is provided and a thin SiGe layer 41 is produced on its surface, optionally by epitaxial growth. Again by epitaxial growth, a monocrystalline silicon layer 42 is produced on the SiGe layer 41. See FIG. 3B. The SiGe layer 41 may have a thickness of a few tens of nanometers. The epitaxial Si-layer 42 may have a thickness of about 100 nm. The Si-layer 42 may be subjected to a doping step (not shown) by implanting the complete layer with p-type doping elements, to turn the layer into a lightly p-doped layer. More preferably, the p-type doping is applied in situ during the epitaxial growth. Then an n-type dopant implant step is performed in a limited area (see FIG. 3C) by masking the wafer except in this limited area, thereby creating an n-well 25 which will become the back side n-well 25 shown in FIG. 1. The dopant densities are in accordance with any suitable standard values for the creation of well regions. A first dopant activation anneal step may be performed at this point, to activate the dopant elements. Epitaxial growth of silicon is then continued, as illustrated in FIG. 3D, until a Si-layer 43 is obtained on the SiGe layer 41, of a thickness that may be in the order of 500 nm. P-type doping of the Si-layer 43 is realized by in-situ doping during the epitaxy, or the Si-layer 43 may be subjected to a p-type dopant implantation (not shown), in order to turn the full Si layer into a lightly p-doped layer, which may again be followed by a dopant activation anneal.

According to suitable processing methods involving lithography and etching, this layer 43 is patterned to form multiple fins 1 of which two groups are shown in FIG. 3E: group I and group II. The fins are uniform with the substrate, now reduced to a lower thickness and referenced by numeral 2, in correspondence with FIG. 1. Additional dopant implant steps are performed to create n-well regions 3a and 3b which include the respective fin groups I and II. Other fins or fin groups not shown in the drawings may be implanted with p-type dopant elements, for example in accordance with a layout scheme of logic cells. At this point, annealing may be performed to activate the dopant elements in the various well regions. It is emphasized that the dopant activation anneal steps may take place at other points in the process, for example after or during the STI deposition process, in accordance with the state of the art. The disclosed technology is not limited, therefore, to a particular approach of these method steps.

As illustrated in FIG. 3F, this is then followed by standard process steps for producing the STI layer 4, and for processing the active portion of the fins to form transistors, which may include the fabrication of a dummy gate, the processing of contact areas 5 for source and drain areas by epitaxy in areas adjacent the dummy gate, and the completion of the transistor by the replacement of the dummy gate by a gate stack comprising a gate dielectric and electrically conductive gate electrode. FIG. 3F illustrates source or drain areas 5 on both groups of fins I and II. On top of the completed transistors and possibly other active devices processed in this way across the full surface of the wafer, an ILD layer 44 is deposited. By standard lithography and etch steps and with reference to FIG. 3G, elongate trenches 45a and 45b are then produced by etching through the ILD layer 44 and the STI 4. The etching stops within the n-wells 3a and 3b.

The trenches 45a and 45b are formed by lithography and etch processes and at dimensions using any suitable methods for creating buried power rails by filling the trenches with an electrically conductive material. This is in fact the aim of these trenches on most of the wafer surface. The trenches extend along a distance perpendicular to the plane of the drawings, in accordance with a given layout of the buried rails. For the purpose of producing the VDMOS of FIG. 1, the trench 45a is fully enveloped by the n-well 3a, i.e., the n-well 3a separates the trench 45a from the substrate 2. A number of additional process steps performed after formation of the trenches then enables the creation of the VDMOS at a selected location of the wafer, in accordance with the disclosed technology, and as illustrated first in FIG. 3H. A layer 46 of silicon nitride is deposited on the wafer, filling the trenches and forming a blanket layer on the wafer surface. The blanket layer is then patterned (see FIG. 3I), so that the SiN is thinned and in some cases removed everywhere from the upper surface of the wafer except in an area 47 above the trench adjacent the first group of fins, where a patch of SiN remains. FIG. 3I shows a section view of the trench 45a, filled with the SiN 46, and with the patch 47 of SiN on top. It is seen in this drawing that the trench is effectively enveloped on all sides by the n-well 3a.

The SiN is then progressively etched back from the upper surface downward (see FIG. 3J), until it is removed from the trenches 45a and 45b, except in the area where the patch 47 of SiN had been maintained. Because of the presence of the patch 47, a plug 21 of SiN remains at the bottom of the trench 45a at the end of the etch-back process. The thickness of the patch 47 determines the thickness of the SiN plug 21. After this, the steps of filling the trenches with an electrically conductive material, optionally a metal, are performed, possibly preceded where necessary by the formation of an dielectric liner on the sidewalls of the trenches. The metal is etched back to form the buried rails 6 in the trench 45b and 20 in the trench 45a, as seen in FIG. 3K. The same drawing illustrates that additional ILD material is deposited on top of the rails, and the rails are connected by via connections 15 and 22 to conductors 13 in the M0 level. On top of the M0 level, and not illustrated in the drawings but as would be understood by the skilled person, the back end of line processing is done, after which the wafer is flipped and bonded to another wafer, with the BEOL side attached thereto, so that the process wafer 40 is now directed upward, as illustrated in FIG. 3L. The process wafer is thinned by grinding and/or CMP, and eventually by an etch process that is stopped by the SiGe layer 41. After the removal of the SiGe, the back side of the +−500 nm thick silicon substrate 43 is exposed, as shown in FIG. 3M. Into the previously formed n-well 25, a contact area 26 is then produced. See also FIG. 3M. In some cases this contact area is formed of a metal silicide. This may be done in a manner known as such in the art, wherein a silicide forming metal is first deposited on the entire wafer surface, then patterned to leave the metal only in the contact area, followed by silicidation through heating, and if necessary the removal of unreacted silicide forming metal. Suitable silicide forming metals are Ni, NiPt, Co or Ti.

After this, additional process steps are performed, such as described in European Publication No. EP3324436A1 for example, for the formation of the backside PDN. As illustrated in FIGS. 3N and 3O, this includes the deposition of a passivation layer 9, and the fabrication, by lithography and etching, of via openings 50a and 50b with the aim of respectively contacting the buried rails 20 and 6 from the backside of the integrated circuit. Characteristically for the disclosed technology, an additional via 51 is produced through the passivation layer 9, above the silicide contact area 26, and this contact area acts as an etch stop layer for the etch process applied for producing the via opening 51, so that the etch process results in deep via openings 50a and 50b reaching down to the surface of the buried rails, and a less deep via 51 reaching down to the silicide area 26. The via opening 50a produced at the location of the SiN plug 21 exposes the SiN plug at the end of the etch process. A dielectric liner is deposited on the sidewalls and the bottom of the via openings 50a and 50b. In correspondence with FIG. 1, the liner is indicated by numeral 8 for the via opening 50b and by numeral 24 for the via opening 50a, but these liners are the same material and deposited simultaneously. The liner 8/24 is removed from the bottom of the TSV openings by a suitable etch process, in some cases by a plasma etch process that creates a protective polymer layer on the sidewalls while removing the liner from the bottom. A suitable process of this type is described, for example, in European Publication No. EP3035369A1. The material of the dielectric plug 21 should be suitably resistant to this plasma etch so that the plug is not removed by the etch process. This is why SiN is a suitable material for the dielectric plug, as SiN is resistant to at least one plasma etch process suitable for removing the liner from the bottom of the via openings 50a and 50b. After removal of the polymer layer, the via openings 50a, 50b and 51 are then filled with an electrically conductive material, preferably a metal, and the process is completed with the further processing of the PDN, leading to the configuration shown in FIG. 1, including the conductors 10 and vias 11 embedded in a dielectric layer 12. This completes the example fabrication process of the VDMOS according to the disclosed technology.

Figure 4A:
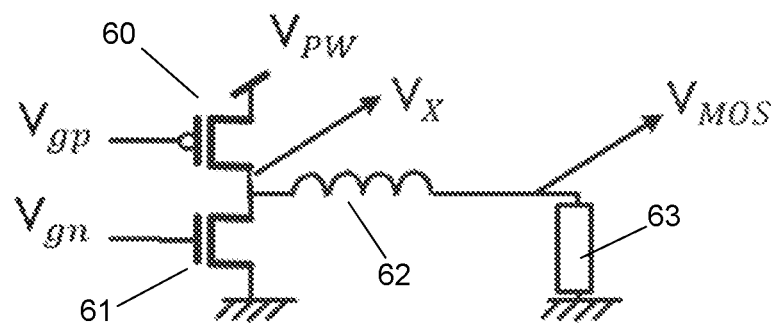
FIGS. 4A and 4B show the electrical circuit of a buck converter and a corresponding implementation in an IC chip, using an n-type and p-type VDMOS transistor in accordance with the disclosed technology.
Figure 4B:
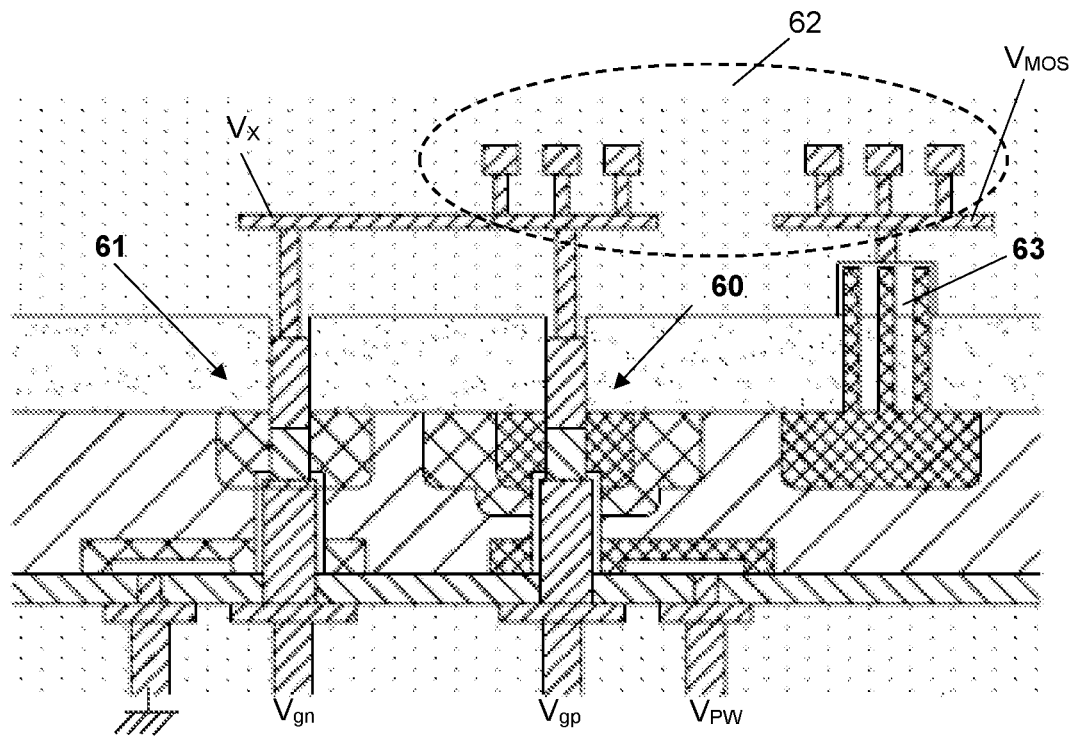

The use of two VDMOS transistors in accordance with the disclosed technology is now described, wherein the transistors are part of a buck converter. FIG. 4A illustrates a basic circuit of such a converter, including a pull-up transistor 60 and a pull-down transistor 61 coupled in series between a power voltage $V_{PW}$ and ground. The gates of the transistors are coupled to control voltages $V_{gp}$ and $V_{gn}$. The pull-up transistor is a p-type transistor while the pull-down transistor is an n-type transistor. An inductance 62 (a coil) is coupled between the common node of the transistors and a load 63. In the case of a power supply for ICs, the load consists of the logic cells and other active devices on the chip. A capacitor may be coupled between the output of the inductance 62 and ground but this is not the case in the circuit shown in FIG. 4A. The control voltages $V_{gp}$ and $V_{gn}$ are synchronized in a manner to convert the power voltage $V_{PW}$ to a lower voltage $V_{MOS}$. The voltage at the common node is referred to as $V_X$. The operation of such a circuit can be implemented in any suitable manner and will not be further described here. FIG. 4B shows the implementation of the buck converter circuit of FIG. 4A, using VDMOS transistors in accordance with the disclosed technology. The voltage levels shown in FIG. 4A are indicated also in FIG. 4B, making it clear that the configuration effectively corresponds to the buck converter circuit. An n-type VDMOS transistor (as in FIG. 2A) and a p-type VDMOS transistor (as in FIG. 2B) according to the disclosed technology are integrated together on the same chip and coupled to a coil in the manner shown in FIG. 4A. The coil is integrated in the back end of line portion of the chip, in the form of an interconnected assembly of suitably formed conductors. The converter supplies power at voltage $V_{MOS}$ to the active devices on the chip.

Figure 5A:
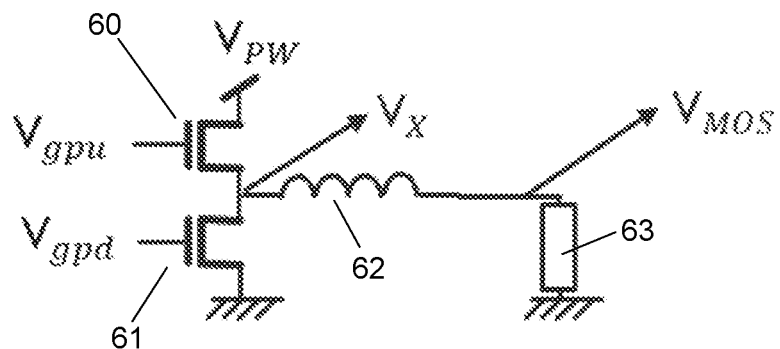
FIGS. 5A to 5C show the electrical circuit of a buck converter and two corresponding implementations in an IC chip, using two n-type VDMOS transistors, in accordance with the disclosed technology.
Figure 5B:
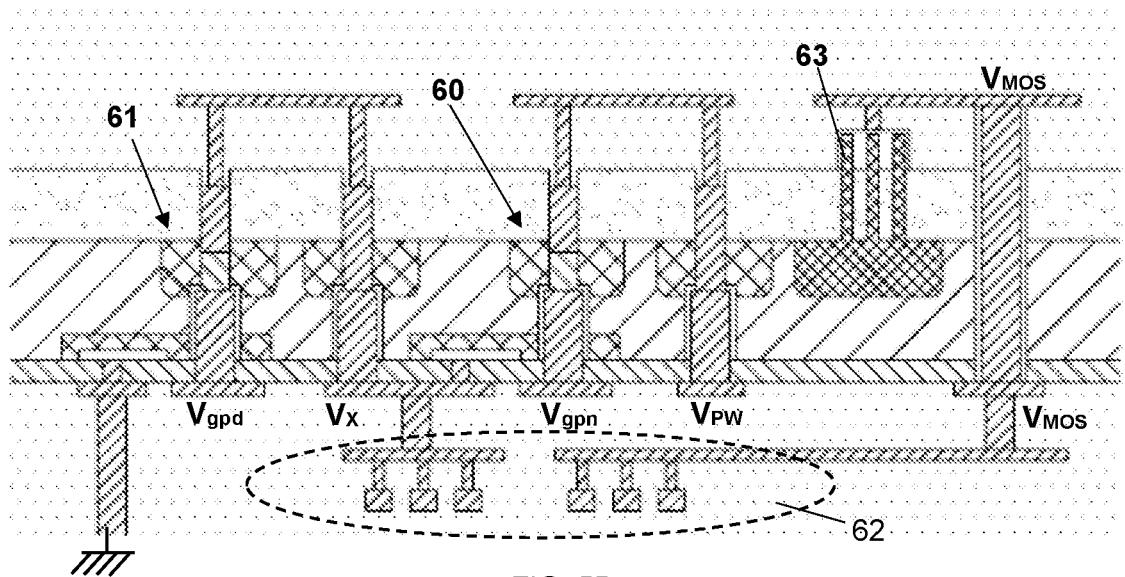

FIG. 5A shows the converter circuit wherein both switches are 60 and 61 n-type transistors. A first implementation with VDMOS transistors according to the disclosed technology is shown in FIG. 5B. It includes three standard TSVs for realizing the node at voltage $V_X$ and the connection to the power voltage $V_{PW}$. The coil 62 is now located on the back side of the chip, and may be incorporated in the back side power delivery network, as shown in the drawing. Alternatively in this case, the coil 62 could be located outside the chip.

Figure 5C:
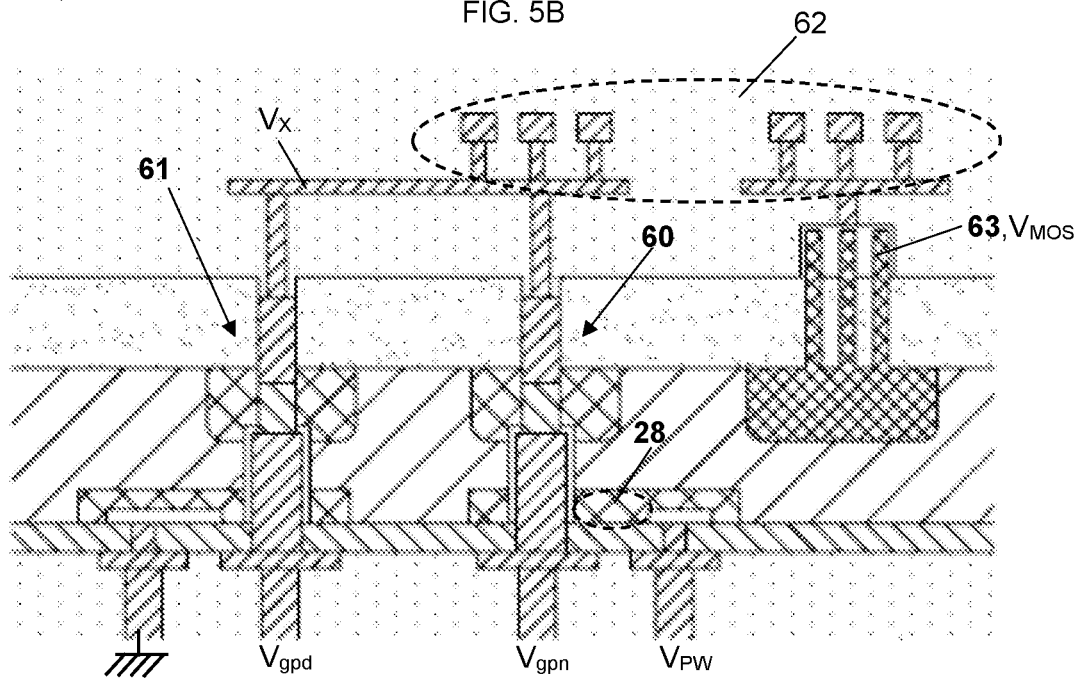

FIG. 5C illustrates an implementation of the circuit of FIG. 5A, using two n-type VDMOS transistors according to the disclosed technology, and wherein the coil 62 is incorporated in the back end of line. This implies that in one of the transistors, the rail acts as the source electrode and the silicide area acts as the drain electrode, i.e., as in the embodiment of FIG. 2C. The transistor 60 is now configured so that the rail acts as the source and the silicide area acts as the drain. The drift region 28 is indicated in FIG. 5C.

Whereas the conductors 10 on the back side of the substrate 2 have been described above as conductors which are part of a power delivery network, the disclosed technology is not limited to chips which have a complete PDN on the back side of the substrate. It is sufficient that at least two conductors 10 are available on the back side, which are accessible from the exterior of the chip, in order to apply a gate voltage to the TSV connection 23 and a source voltage to the contact area 26, or obtain a drain voltage at the contact area 26 depending on the function of the latter.

Figure 6A:
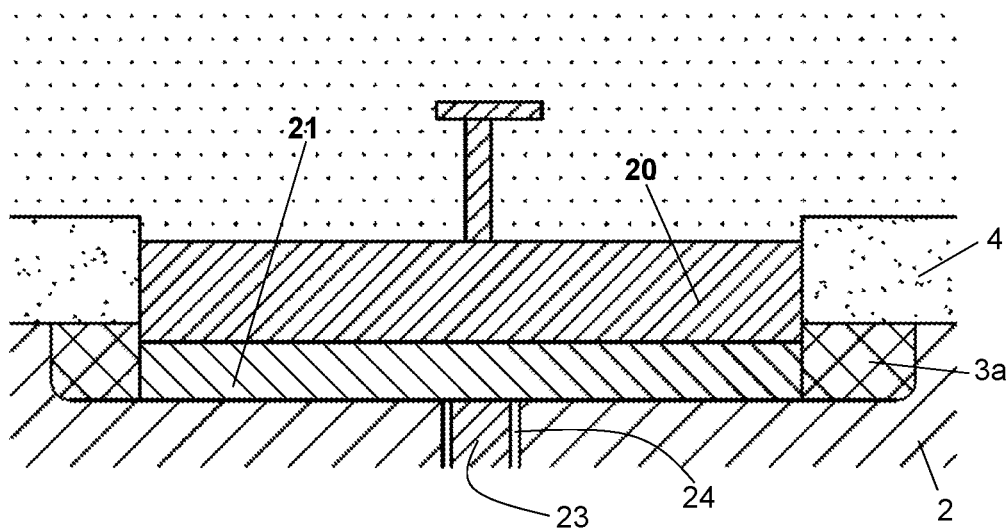
FIGS. 6A and 6B show alternative configurations of the dielectric plug and the rail acting as source or drain in a transistor according to the disclosed technology.
Figure 6B:
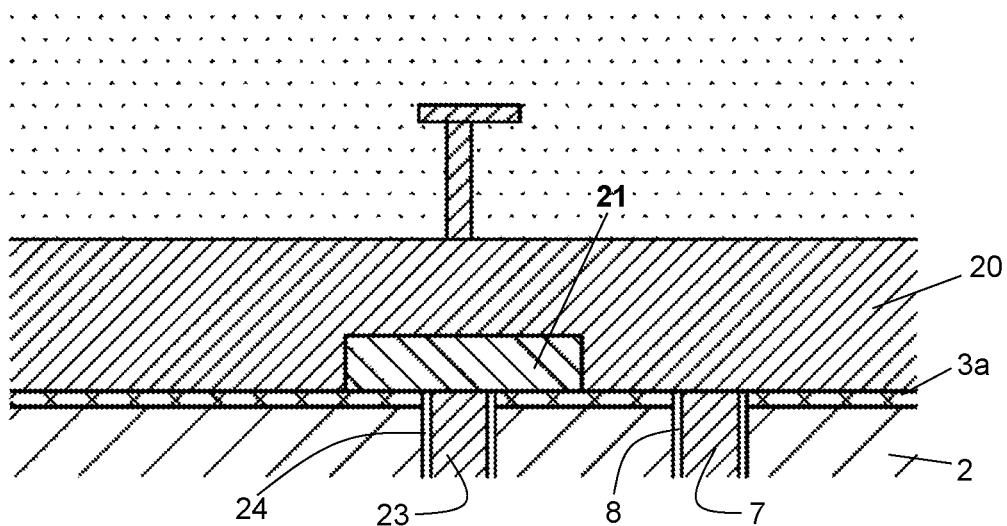

In the embodiments shown up to this point in the drawings and best visible in the section A-A in FIG. 3K, the, the dielectric plug 21 is shorter than the rail 20 and the dielectric plug fills a cavity on the underside of the rail, as a consequence of the example production process described above. This is one embodiment of the following feature described and claimed herein: "a rail formed of an electrically conductive material, and buried at least partially in the first well region, and provided with a dielectric plug in physical contact with the underside of the rail, and configured so that the rail does not extend beyond the lower side of the first well region 3a." Other embodiments may fulfill the scope of this feature, examples of which are shown in FIGS. 6A and 6B. In the embodiment of FIG. 6A, the plug extends along the full length of the rail 20. The plug 21 itself may in this case extend approximately down to the lower side of the n-well 3a as shown in the drawing. In reality, this means that the bottom of the plug is in or near the gradient area defined by the diffusion tail of the implanted ions used to create the well. FIG. 6A also shows part of the VDMOS gate electrode 23 and the gate dielectric 24. In the case of FIG. 6B, the rail 20 is a continuous rail, which may be electrically connected to a standard TSV 7 (shown with its liner 8 in FIG. 6B). Besides this, the dielectric plug 21 extends along a portion of the rail's underside, and the VDMOS gate electrode 23 is in contact with the plug 21, as in the embodiment of FIG. 1. The rail 20 in its entirety is once again separated from the substrate 2 by the n-well 3a. This is a special case, applicable only when the rail 20 is the source of the VDMOS and when the source is held to ground potential. In this case, rail 20 can be a grounded rail of the Power delivery network, for example.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Unless specifically specified, the description of a layer being present, deposited or produced "on" another layer or substrate, includes the options of:
- the layer being present, produced or deposited directly on, i.e., in physical contact with, the other layer or substrate, and
- the layer being present, produced or deposited on one or a stack of intermediate layers between the layer and the other layer or substrate.

What is claimed is:

1. A vertical insulated gate field effect transistor integrated in a semiconductor chip that includes a substrate formed of a doped semiconductor material, the substrate having a front side and a back side, wherein a front end of line and a back end of line portion are present on the front side, the transistor comprising:
   in the substrate and located at the front side thereof, a first well region having a lower side;
   in the substrate and located at the back side thereof and having an upper side spaced apart from the lower side of the first well region, a second well region;
   a rail formed of an electrically conductive material, and buried at least partially in the first well region, and provided with a dielectric plug in physical contact with the underside of the rail, and configured so that the rail does not extend beyond the lower side of the first well region, wherein the rail is the source or drain electrode of the transistor; and
   a through substrate via (TSV) between the back side of the substrate and the dielectric plug, a liner isolating the TSV from the substrate and from the second well region, wherein the dielectric plug isolates the TSV from the rail and wherein the TSV acts as the gate electrode of the transistor, with the liner acting as the gate dielectric, and a contact area in the second well region, the contact area being exposed at the back side of the substrate, wherein the contact area is respectively the drain or source electrode of the transistor.

2. The transistor according to claim 1, wherein the substrate comprises at least two conductors on its back side, connected respectively to the TSV and to the contact area.

3. The transistor according to claim 2, wherein the at least two conductors on the back side of the substrate are part of a signal delivery network arranged on the back side of the substrate.

4. The transistor according to claim 3, wherein the chip further comprises a plurality of interconnect rails buried at least partially in the substrate, and wherein the interconnect rails are:
   coupled to active devices in the FEOL portion through local interconnects embedded in a interlayer dielectric (ILD) layer on the front side of the substrate; and
   electrically connected to the signal delivery network on the back side of the substrate through TSV connections, wherein the interconnect rails and the assembly of the rail and the dielectric plug are formed in a plurality of trenches which are obtainable by a single etching step.

5. The transistor according to claim 1, wherein the substrate is formed of a doped material of a first doping type, and wherein the first and second well regions are formed of a second doping type opposite the first doping type.

6. The transistor according to claim 1, wherein the substrate is formed of a doped material of a first doping type, and wherein:
   the first and the second well regions are of the first doping type; and
   the first well region is embedded in a third well region, the third well region being of a second doping type opposite the first.

7. The transistor according to claim 1, wherein the substrate is a p-doped or n-doped silicon substrate.

8. The transistor according to claim 1, wherein the dielectric plug is formed of silicon nitride.

9. The transistor according to claim 1, wherein the contact area in the second well region is formed of a metal silicide.

10. The transistor according to claim 1, wherein the first well region is a well region of the semiconductor chip, the first well region comprising active devices of the FEOL portion.

11. A buck converter circuit for supplying power to active devices in a front end of line portion of a semiconductor chip, the circuit comprising a pull-up transistor, a pull-down transistor and an inductance, wherein the pull-up and pull-down transistors are transistors of claim 1 integrated in the semiconductor chip.

12. A method of producing a transistor according to claim 1, comprising:
   providing a wafer having on its surface a doped semiconductor substrate that comprises a first well region at the front of the substrate and a second well region at the back of the substrate and spaced apart from the first well region;
   on the front of the substrate, producing a front end of line portion, and depositing an ILD dielectric layer on top of the FEOL portion;
   etching at least one trench in the front side of the substrate, through the ILD dielectric layer and into the front of the substrate;
   depositing a dielectric layer that fills the at least one trench and forms a blanket layer on the front surface of the substrate;
   thinning the blanket layer everywhere except in a selected area above the at least one trench;
   etching back the material of the dielectric layer until a dielectric plug remains at the bottom of the at least one trench;
   filling the trench with an electrically conductive material, and etching back the electrically conductive material so as to obtain a buried rail;
   producing a back end of line portion on the FEOL portion;
   reversing the wafer and attaching the back end of line side of the wafer to an auxiliary substrate;
   thinning the wafer until the back side of the substrate is exposed;
   producing a contact area in the second well region and exposed at the back side of the substrate;
   depositing a passivation layer on the back side of the substrate;
   producing a first via opening through the passivation layer and the substrate, at the location of the rail, until reaching the dielectric plug;

producing a second via opening through the passivation layer, until reaching the contact area in the second well region;

producing a dielectric liner on the sidewall of the first via opening; and filling the first and second via openings with an electrically conductive material, thereby producing a first and second TSV.

13. The method according to claim 12, further comprising forming conductors for separately contacting the first and second TSV on the back side of the substrate.

14. The method according to claim 13, wherein the conductors are part of a power delivery network formed on the back side of the substrate.

15. The method according to claim 14, wherein:

additional trenches are produced which have the same depth and dimensions of the at least one trench, and which are all filled with the dielectric layer, etching back the dielectric layer continues until the material of the dielectric layer is fully removed from the additional trenches, so that the dielectric plug remains in only one or some of the full number of trenches, the additional trenches are filled with an electrically conductive material simultaneously with the filling of the at least one trench having the dielectric plug at the bottom, additional via openings are etched from the back of the substrate, simultaneously with the etching of the via opening at the location of the dielectric plug, and the additional via openings are filled with an electrically conductive material simultaneously with the filling of the first and second via openings.

\* \* \* \* \*